(12) United States Patent
Takahashi

(10) Patent No.: US 7,106,616 B2
(45) Date of Patent: Sep. 12, 2006

(54) FERROELECTRIC MEMORY WITH IMPROVED LIFE SPAN

(75) Inventor: Kazuhiko Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/947,374

(22) Filed: Sep. 23, 2004

(65) Prior Publication Data

US 2005/0226028 A1   Oct. 13, 2005

(30) Foreign Application Priority Data

Apr. 5, 2004 (JP) .............................. 2004-110772

(51) Int. Cl.
*G11C 11/22* (2006.01)
(52) U.S. Cl. ............. 365/145; 365/230.03; 365/230.06
(58) Field of Classification Search ................ 365/145, 365/65, 230.03, 230.06
See application file for complete search history.

(56) References Cited

U.S. PATENT DOCUMENTS

| | | | |
|---|---|---|---|
| 5,373,463 A * | 12/1994 | Jones Jr. ..................... | 365/145 |
| 5,917,746 A * | 6/1999 | Seyyedy ..................... | 365/145 |
| 6,038,162 A * | 3/2000 | Takata et al. ............... | 365/145 |
| 6,058,040 A | 5/2000 | Tada | |
| 6,503,819 B1 * | 1/2003 | Tanabe et al. .............. | 438/591 |
| 6,735,106 B1 * | 5/2004 | Rickes et al. ............... | 365/145 |
| 2002/0024840 A1 * | 2/2002 | Noro et al. .................. | 365/145 |
| 2002/0051377 A1 | 5/2002 | Choi et al. | |

FOREIGN PATENT DOCUMENTS

JP   10-320981   12/1998
JP   2002-184171   6/2002

* cited by examiner

*Primary Examiner*—Huan Hoang
(74) *Attorney, Agent, or Firm*—Rabin & Berdo, P.C.

(57) ABSTRACT

Memory cell units 111, each having ferroelectric memory cells in one row by a plurality of columns, are arrayed in a matrix. Plate lines are provided for each of the units 111. PLE control circuits output plate enable signals PLE. When one of the units 111 is selected, the signal PLE is supplied to all the plate lines in the corresponding row and all the plate lines in the other rows are grounded. The plate enable signal in the column including the selected unit 111 is at high level and the plate enable signals in the other columns are at low level. Thus, only the plate line of the selected unit 111 is at high level and all the other plate lines are at low level.

6 Claims, 6 Drawing Sheets

US 7,106,616 B2

FERROELECTRIC MEMORY WITH IMPROVED LIFE SPAN

BACKGROUND OF THE INVENTION

1. Field of the Invention

The present invention relates to a ferroelectric memory, more particularly, to a technology for restraining data destruction in a ferroelectric memory due to noise or the like.

2. Description of the Related Art

Conventionally, a memory for storing binary information by utilizing the state of polarization of a ferroelectric capacitor formed on a semiconductor substrate has been known. It is called ferroelectric memory.

FIG. 5 is a graph for illustrating the principle of such a ferroelectric device. In FIG. 5, the vertical axis represents polarization P ($\mu C/cm^2$) and the horizontal axis represents voltage V (volt). As shown in FIG. 5, the relation between the voltage V and the polarization P exhibits a hysteresis curve H. The inclination of the hysteresis curve H is equivalent to the capacitance [q/V] of the ferroelectric capacitor.

In FIG. 5, it is assumed that the coordinates of an intersection A of the hysteresis curve H and the P-axis in a region of P>0 are (0, p0). Also, a line Cb1 that passes a point B (Vcc, p0) and intersects a line P=p0 at an angle θ is plotted. The angle θ is determined in accordance with the capacitance of a bit line. Moreover, it is assumed that the coordinates of an intersection C the line Cb1 and a reverse response region of the hysteresis curve H are (v1, p1). In this case, the coordinate v1 of the point C coincides with the voltage between the terminals of the ferroelectric capacitor, and the difference v1 (=Vcc−V1) in V-coordinate between the points B and C is the reading voltage (high level) of this ferroelectric device.

In FIG. 5, it is assumed that the coordinates of an intersection D of the hysteresis curve H and the P-axis in a region of P<0 are (0, p2). Also, a line Cb2 that passes a point E (Vcc, p2) and intersects a line P=p2 at the angle θ is plotted. Moreover, it is assumed that the coordinates of an intersection F of the line Cb2 and a non-reverse response region of the hysteresis curve H are (v2, p3). In this case, the coordinate v2 of the point F coincides with the voltage between terminals of the ferroelectric capacitor, and the difference v2 (=Vcc−V2) in V-coordinate between the points E and F is a reading voltage (low level) of this ferroelectric device.

The difference ΔV (=|v1−v2|) in V-coordinate between the points C and F is equivalent to the reading margin of this ferroelectric device. In a 2T2C-type ferroelectric memory (that is, a ferroelectric memory that stores one bit of data by using a pair of ferroelectric capacitors), when ΔV becomes smaller than the discrimination sensitivity of a sense amplifier, the data will have been broken. In a 1T1C-type ferroelectric memory (that is, a ferroelectric memory that stores one bit of data by using one ferroelectric capacitor), when ΔV/2 becomes smaller than the discrimination sensitivity of the sense amplifier, the data will have been broken.

FIG. 6 is a circuit diagram showing the structure of an essential part of a conventional 1T1C-type ferroelectric memory. As shown in FIG. 6, a ferroelectric memory 600 has jxn memory cells MC00 to MCjn for each of memory cell blocks MB0 to MBm. The memory cells of one column in one memory cell block (that is, n memory cells) correspond to one address. The memory cells MC00 to MCjn have one ferroelectric capacitor each, that is, the respective ferroelectric capacitors C00 to Cjn, and one selection transistor each, that is, the respective selection transistors T00 to Tjn. Also, word lines WL0 to WLj and plate lines PL0 to PLj, which are common to the memory cell blocks MB0 to MBm, are arranged in the corresponding rows of the memory cells MC00 to MCjn, respectively. Meanwhile, in each of the memory cell blocks MB0 to MBm, bit lines BL00 to BLmn are provided in the corresponding columns of the memory cells MC00 to MCjn, respectively.

For example, in the case of reading data from the 0-th row (memory cells MC00 to MC0n) of the memory cell block MB0, the word line WL0 and the plate line PL0 are activated by a control circuit (not shown). This turns on the selection transistors T00 to T0n in the 0-th row of each of the memory cell blocks MB0 to MBm, and plate potential is applied to one-side ends of the ferroelectric capacitors C00 to C0n. Thus, in each of the memory cell blocks MB0 to MBm, stored data in the memory cells MC00 to MC0n in the 0-th row are output to the bit lines BL00 to BLmn. The potential of the bit lines BL00 to BLmn is amplified by sense amplifiers SA0 to SAm and sent to a selector circuit 620. The selector circuit 620 selects the bit lines BL00 to BL0n of the memory cell block MB0 from the bit lines BL00 to BLmn and connects the selected bit lines to an n-bit bus 630. Thus, stored data in the 0-th row in the memory cell block MB0 are outputted to outside.

Since the ferroelectric memory performs destructive reading, it is necessary to perform rewriting to all the memory cells from which data is read out. For example, even when data is read out from the 0-th row in the memory cell block MB0 as described above, the data of the 0-th rows in all the memory cell blocks MB0 to MBm are actually read out and therefore, rewriting to all these memory cells blocks MB0 to MBm must be carried out. In rewriting, potential amplified by the sense amplifiers SA0 to SAm is applied again to the bit lines BL00 to BLmn in the state where the word line WL0 and the plate line PL0 have been activated. Thus, the potential of the bit lines BL00 to BLmn is rewritten to the ferroelectric capacitors C00 to C0n in the 0-th row in each of the memory cell blocks MB0 to MBm.

In this manner, in the ferroelectric memory 600 of FIG. 6, every time data of one address is read out, data in the same row must be read out from and rewritten to all the memory cell blocks MB0 to MBm. This is a cause of short device life of the ferroelectric memory 600. Moreover, in the ferroelectric memory 600, since the plate lines PL0 to PLj common to all the memory cell blocks MB0 to MBm are provided, a plate line driver (not shown) having high driving capability is necessary for securing high-speed operation and it causes increase in circuit scale.

On the other hand, FIG. 1 of the following Patent Document 1 discloses a ferroelectric memory having a structure in which plate lines are divided for each memory cell block and in which the divided plate lines can be activated individually. In this ferroelectric memory with such a structure, when reading data of one address, data may be read out from and rewritten to only the memory cells corresponding to that address, and reading from and rewriting to the other memory cell blocks are not necessary. As the frequency of reading from and rewriting to each memory cell can be reduced, the device life becomes longer. Also, since it suffices to activate only one of the divided plate lines, high-speed operation can be secured even when a plate line driver having low driving capability is used.

In the ferroelectric memory described in FIG. 1 of Japanese Patent Application Kokai, No. 10-320981 (hereinafter, referred to as Patent Document 1), all the plate lines corresponding to the memory cells except for selected memory cells (that is, the n memory cells from/to which reading or writing is performed) are in a floating state. However, the plate lines in the floating state are susceptible to the influence of peripheral noise and the influence of signal coupling of the bit lines and the other plate lines. Therefore, at the time of reading from or writing to the selected memory cells, the polarization state of the ferroelectric capacitors in the non-selected memory cells may change. Such change in the polarization state causes change of the reading margin $\Delta V$ (see FIG. 5) and destruction of stored data.

Meanwhile, a ferroelectric memory in which plate lines in non-selected rows are grounded to enable prevention of data destruction in the memory cells connected to the plate lines is disclosed in Japanese Patent Application Kokai, No. 2002-184171 (hereinafter, referred to as Patent Document 2). However, with the technique of Patent Document 2, while plate lines in rows that are different from the row of selected memory cells can be grounded, plate lines corresponding to non-selected memory cells in the same row as the selected memory cells cannot be grounded.

SUMMARY OF THE INVENTION

It is an object of the present invention to provide a ferroelectric memory in which reading from and rewriting to memory cells except for selected memory cells are not necessary and in which data destruction in non-selected memory cells can be prevented.

A ferroelectric memory according to the present invention comprises: a memory cell array formed by arraying memory cell units in a matrix, each memory cell unit having ferroelectric memory cells in one row and a plurality of columns; a plurality of word lines provided one for each row of the memory cell units, each word line being commonly connected to the ferroelectric memory cells in the same row; a plurality of plate lines provided one for each memory cell unit, each plate line being commonly connected to the ferroelectric memory cells in the same memory cell unit; a plurality of plate-enable signal lines provided one for each column of the memory cell units; a plurality of bit lines provided one for each column of the ferroelectric memory cell, each bit line being commonly connected to the ferroelectric memory cells in the same column; a word line driver for activating only the word line corresponding to the selected memory cell unit, of the plurality of word lines; a plate enable control circuit for activating only the plate-enable signal line corresponding to the selected memory cell unit, of the plurality of plate-enable signal lines; and plate line drivers provided one for each column of the memory cell units, the plate line drivers supplying activation potential or non-activation potential to the plate line corresponding to the activated word line in accordance with potential of the plate-enable signal line and supplying non-activation potential to the plate line corresponding to the non-activated word line.

According to the present invention, non-activation potential is applied by the plate line driver to a plate line in a row that is different from a selected memory cell unit, of plate lines corresponding to non-selected memory cell units. Also, potential corresponding to the plate-enable signal line is applied to a plate line in the same row as the selected memory cell unit, of the plate lines corresponding to the non-selected memory cell units. In this case, activation potential is applied to the selected memory cell unit and non-activation potential is applied to the other memory cell units in the same row. Therefore, according to the present invention, all the plate lines corresponding to the non-selected memory cell units are fixed at non-activation potential and do not enter a floating state. Therefore, with the ferroelectric memory according to the present invention, data destruction in the non-selected memory cells can be prevented.

DETAILED DESCRIPTION OF THE PREFERRED EMBODIMENTS

Figure 1:
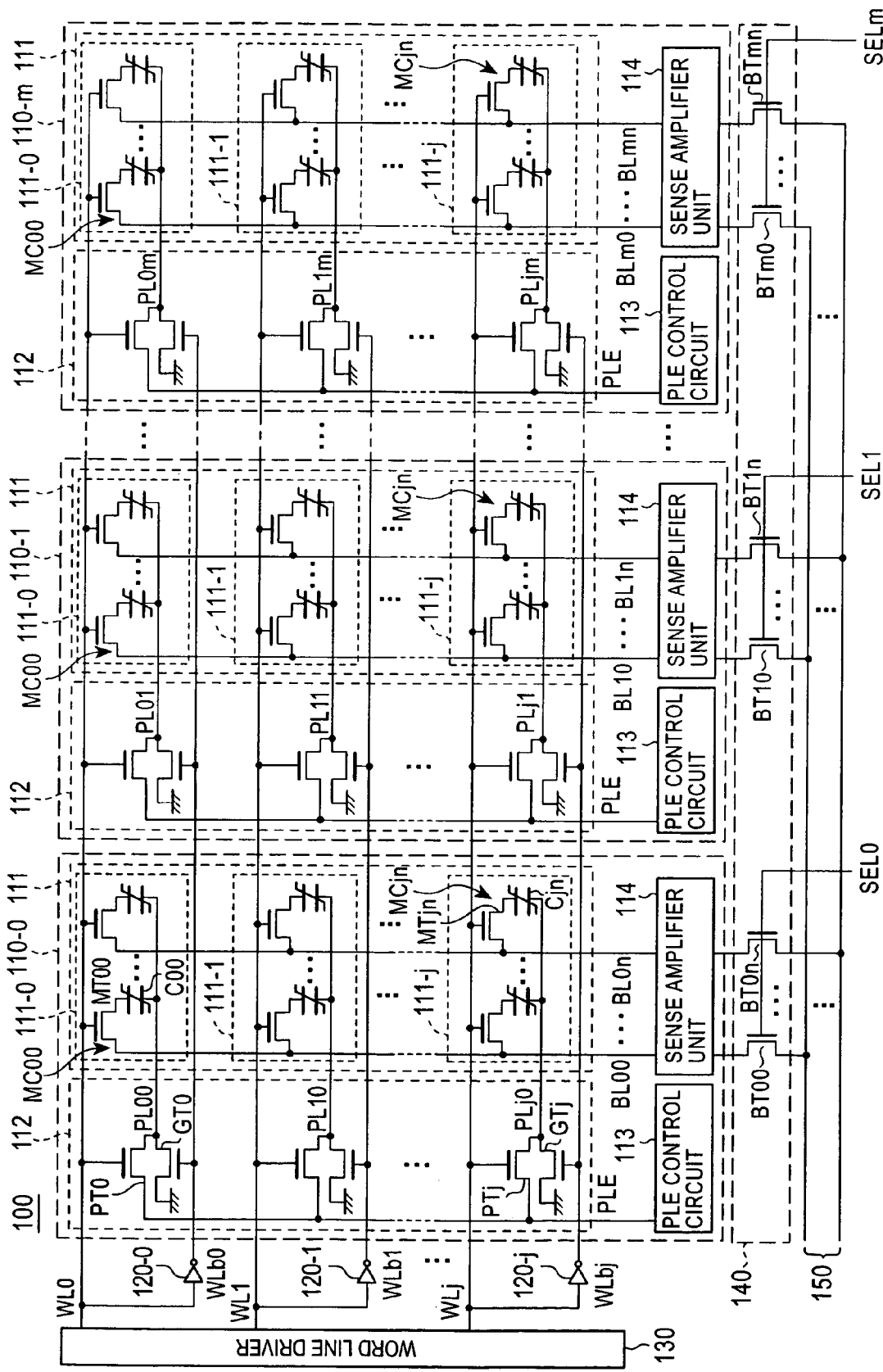
FIG. 1 is a circuit diagram showing the structure of an essential part of a ferroelectric memory according to a first embodiment.

Embodiments of the present invention will now be described with reference to the drawings. In the drawings, the sizes and shapes of and positional relations between constituent elements are only schematically shown to the extent that the present invention can be understood. Also, the numerical conditions that will be described hereinafter are simply exemplary conditions.

First Embodiment

A ferroelectric memory according to a first embodiment will now be described with reference to FIG. 1.

FIG. 1 is a circuit diagram showing the structure of a ferroelectric memory 100 according to this embodiment. As shown in FIG. 1, the ferroelectric memory 100 according to the embodiment has m+1 array blocks 110-0 to 110-m, a j+1 number of inverters 120-0 to 120-j, one word line driver 130, a selector unit 140, word lines WL0 to WLj, inverse word lines WLb0 to WLbj, plate lines PL00 to PLjm, bit lines BL00 to BLmn, and a bus 150 of n+1 bits.

Each of the array blocks 110-0 to 110-m has a memory cell region 111, a plate line driver 112, a PLE control circuit 113, and a sense amplifier unit 114.

The memory cell region 111 has memory cells MC00 to MCjn that are arranged in j+1 rows by n+1 columns. In the same array block, the same address is allocated to the memory cells in the same row. For example, address 00 is allocated to the memory cells MC00 to MC0n in the 0-th row in the array block 110-0. Address jm is allocated to the memory cells MC00 to MC0n in the j-th row in the array block 110-m. In this embodiment, a group of memory cells belonging to the same address is called memory cell unit. As shown in FIG. 1, in the memory cell region 111 of each of the array blocks 110-0 to 110-j, memory cell units 111-0 to 111-j are provided. The memory cell units 111-0 to 111-j have one plate line each, that is, the plate lines PL00 to PLjm, respectively. The memory cells MC00 to MCjn have one ferroelectric capacitor each, that is, ferroelectric capacitors C00 to Cjn, respectively, and one selection transistor each, that is, selection transistors MT00 to MTjn, respectively. One-side ends of the ferroelectric capacitors C00 to Cjn are connected to the corresponding plate lines PL00 to PLjm. The selection transistors MT00 to MTjn have their respective drains connected to the other-side ends of the corresponding ferroelectric capacitors, have their respective sources connected to the corresponding bit lines, and have their respective gates connected to the corresponding word lines.

Each of the plate line drivers 112 has transistors PT0 to PTj for plate voltage application and transistors GT0 to GTj for grounding. The transistors PT0 to PTj have their respective gates connected to the corresponding word lines, have their respective drains connected to the corresponding plate lines, and have their respective sources connected to a plate-line-enable signal line PLE of the corresponding PLE control circuit 113. The transistors GT0 to GTj have their respective gates connected to the corresponding inverse word lines, have their respective drains connected to the corresponding plate lines, and have their respective sources grounded.

Each of the PLE control circuits 113 inputs a read address or write address (not shown) from outside. If this address is the address of the array block corresponding to the PLE control circuit 113 in question, the potential of the plate-enable signal line PLE is set at high level. If the address is the address of another array block, the potential of the plate-enable signal line PLE is set at low level.

The sense amplifier units 114 are connected to the corresponding bit lines BL00 to BLmn. When performing writing, the sense amplifier units 114 amplify the potential inputted from the selector unit 140 and output the amplified potential to the corresponding bit lines. When performing reading, the sense amplifier units 114 amplify the potential of the corresponding bit lines and output the amplified potential to the selector unit 140. When performing rewriting, the sense amplifier units 114 amplify the potential of the corresponding bit lines and output the amplified potential to the bit lines.

The inverters 120-0 to 120-j are provided for the inverse word lines WLb0 to WLbj, respectively, which will be described later. The inverters 120-0 to 120-j have the irrespective input terminals connected to the corresponding word lines and have their respective output terminals connected to the corresponding inverse word lines.

The word line driver 130 inputs a read address or write address from outside. Then, the word lines driver 130 sets the word line corresponding to the inputted address at high level and sets the other word lines at low level.

The selector unit 140 selectively connects one of the groups of bit lines BL00 to BL0n, BL10 to BL1n, . . . and BLm0 to BLmn corresponding to the array blocks 110-0 to 110-m, respectively, to the bus 150. The selector unit 140 has transistors BT00 to BTmn for bit line selection. These transistors BT00 to BTmn have their one-side ends connected to the bit lines and have their other ends connected to the bus 150. The gates of these transistors BT00 to BTmn input corresponding ones of row address selection signals SEL0 to SELm.

The word lines WL0 to WLj are provided corresponding to the individual rows in the memory cell units 111-0 to 111-j and are common to the array blocks 110-0 to 110-m.

The inverse word lines WLb0 to WLbj are provided corresponding to the individual rows in the memory cell units 111-0 to 111-j and are common to the array blocks 110-0 to 110-m.

The plate lines PL00 to PLjm are provided for the individual rows in the memory cell units 111-0 to 111-j, respectively, and are divided by each of the array blocks 110-0 to 110-m.

The bit lines BL00 to BLmn are provided for individual columns in the memory cell units 111-0 to 111-j, respectively.

The bus 150 has the same number of signal lines as the number of memory cells per address (in this example, n+1). These signal lines are connected to the corresponding signal terminals of the selector unit 140, respectively.

Next, reading operation from the ferroelectric memory 100 according to this embodiment will be described with reference to a case of reading data at address 00 as an example.

In the initial state, the word line driver 130 sets all the word lines WL0 to WLj at low level and the PLE control circuits 113 set the potential of all the plate-enable signal lines PLE at low level. In this state, since all the selection transistors MT00 to MTjn in the array blocks 110-0 to 110-m are off, the other ends of the ferroelectric capacitors C00 to Cjn are not connected to the bit lines BL00 to BLmn. Also in this state, the transistors PT0 to PTj for plate voltage application in each plate line driver 112 are off. On the other hand, since the inverse word lines WLb0 to WLbj are at high level, the transistors GT0 to GTj for grounding are on. Therefore, the plate lines PL00 to PLjm are at ground potential and the potential of the one-side ends of the ferroelectric capacitors C00 to Cjn is thus fixed at the ground potential.

When reading data at address 00, first, the potential of the word line WL0 is changed to high level and the potential of the plate-enable signal line PLE in the array block 110-0 is changed to high level. In this state, the potential of the other word lines WL1 to WLj and the potential of the plate-enable signal lines PLE in the other array blocks 110-1 to 110-m remain at low level. As the potential of the word line WL0 is changed to high level, the selection transistors MT00 to MT0n in the memory cell unit 111-0 corresponding to address 00 are turned on and therefore the other ends of the ferroelectric capacitors C00 to C0n in this memory cell unit 111-0 are connected to the bit lines BL00 to BL0n. Also, since the potential of the word line WL0 is changed to high level, the transistor PT0 for plate voltage application in the 0-th row is turned on and the transistor GT0 for grounding in the 0-th row is turned off, in all the array blocks 110-0 to 110-m. Therefore, the potential of the one-side ends of all the ferroelectric capacitors C00 to C0n in the 0-th row in the array blocks 110-0 to 110-m becomes equal to the potential of the corresponding plate-enable signal lines PLE. At this point, the potential of the plate-enable signal line PLE in the array block 110-0 is at high level, where as the potential of the plate-enable signal lines PLE in the other array blocks 110-1 to 110-m is at low level (that is, ground potential). Therefore, in the array block 110-0, the potential of the one-side ends of the ferroelectric capacitors C00 to C0n is changed to high level, and in the other array blocks 110-1 to 110-m, the potential of the one-side ends of the ferroelectric capacitors C00 to C0n is maintained at the ground potential.

In this state, since the potential of the other word lines WL1 to WLj is set at low level, the potential of the inverse word lines WLb1 to WLbj is at high level. Therefore, the transistors PT1 to PTj for plate voltage application are off and the transistors GT1 to GTj for grounding remain on. Accordingly, in all the other array blocks 110-1 to 110-m, the potential of the one-side ends of the ferroelectric capacitors C10 to Cjn is maintained at the ground potential.

In this manner, data is read only from the ferroelectric capacitors C00 to C0n corresponding to address 00.

Then, the selector unit 140 selects the bit lines BL00 to BL0n in the array block 110-0. This causes the potential of the bit lines BL00 to BL0n to be outputted to the bus 150.

After that, the sense amplifier unit 114 of the array block 110-0 outputs amplified bit line potential to these bit lines BL00 to BL0n. Rewriting to the ferroelectric capacitors C00 to C0n corresponding to address 00 is thus performed.

When the rewriting is finished, the potential of the word line WL0 is returned to low level and the potential of the plate-enable signal line PLE in the array block 110-0 is returned to low level. This ends the data reading operation.

In this manner, in this embodiment, all the plate lines, except for the plate line in the memory cell unit from which data is reading, are maintained at the ground potential and do not enter the floating state.

Next, writing operation to the ferroelectric memory 100 according to this embodiment will be described with reference to a case of writing data at address 00 as an example.

The initial state is similar to the initial state of the above-described reading operation. That is, the word line driver 130 sets all the word lines WL0 to WLj at low level and all the PLE control circuits 113 set the potential of the plate-enable signal lines PLE at low level. Therefore, the one-side ends of the ferroelectric capacitors C00 to Cjn are fixed at the ground potential and their other ends are not connected to the bit lines BL00 to BLmn.

When writing data at address 00, the potential of the word line WL0 is changed to high level and the potential of the plate-enable signal line PLE in the array block 110-0 is changed to high level, as in the reading operation. Thus, in the memory cell unit 111-0 corresponding to address 00, the other ends of the ferroelectric capacitors C00 to C0n are connected to the bit lines BL00 to BL0n. The potential of the one-side ends of the ferroelectric capacitors C00 to C0n in the array block 110-0 is changed to high level, but the potential of the one-side ends of all the other ferroelectric capacitors remains fixed at the ground potential.

Then, the selector unit 140 selects the bit lines BL00 to BL0n in the array block 110-0. This causes the potential of the bus 150 to be outputted to the bit lines BL00 to BL0n. Data corresponding to the potential of the bus 150 is thus written to the ferroelectric capacitors C00 to C0n corresponding to address 00.

After that, the potential of the word line WL0 is changed to low level and the potential of the plate-enable signal line PLE in the array block 110-0 is changed to low level. This ends the data writing operation.

In this manner, in this embodiment, all the plate lines, except for the plate line in the memory cell unit to which data is written, are maintained at the ground potential and do not enter the floating state.

As described above, in the ferroelectric memory 100 according to this embodiment, the plate lines connected to the ferroelectric capacitors, except for the ferroelectric capacitor of the address at which data reading or writing is performed, are fixed at low level and do not enter the floating state. Therefore, these plate lines are less susceptible to the influence of peripheral noise and the influence of signal coupling of the bit lines and the other plate lines. Therefore, in the ferroelectric capacitors in the memory cells where reading or writing is not performed, the polarization state does not change easily. Thus, with the ferroelectric memory 100 according to this embodiment, data destruction can be prevented.

Second Embodiment

Next, a ferroelectric memory according to a second embodiment will be described with reference to FIGS. 2 and 3.

Figure 2:
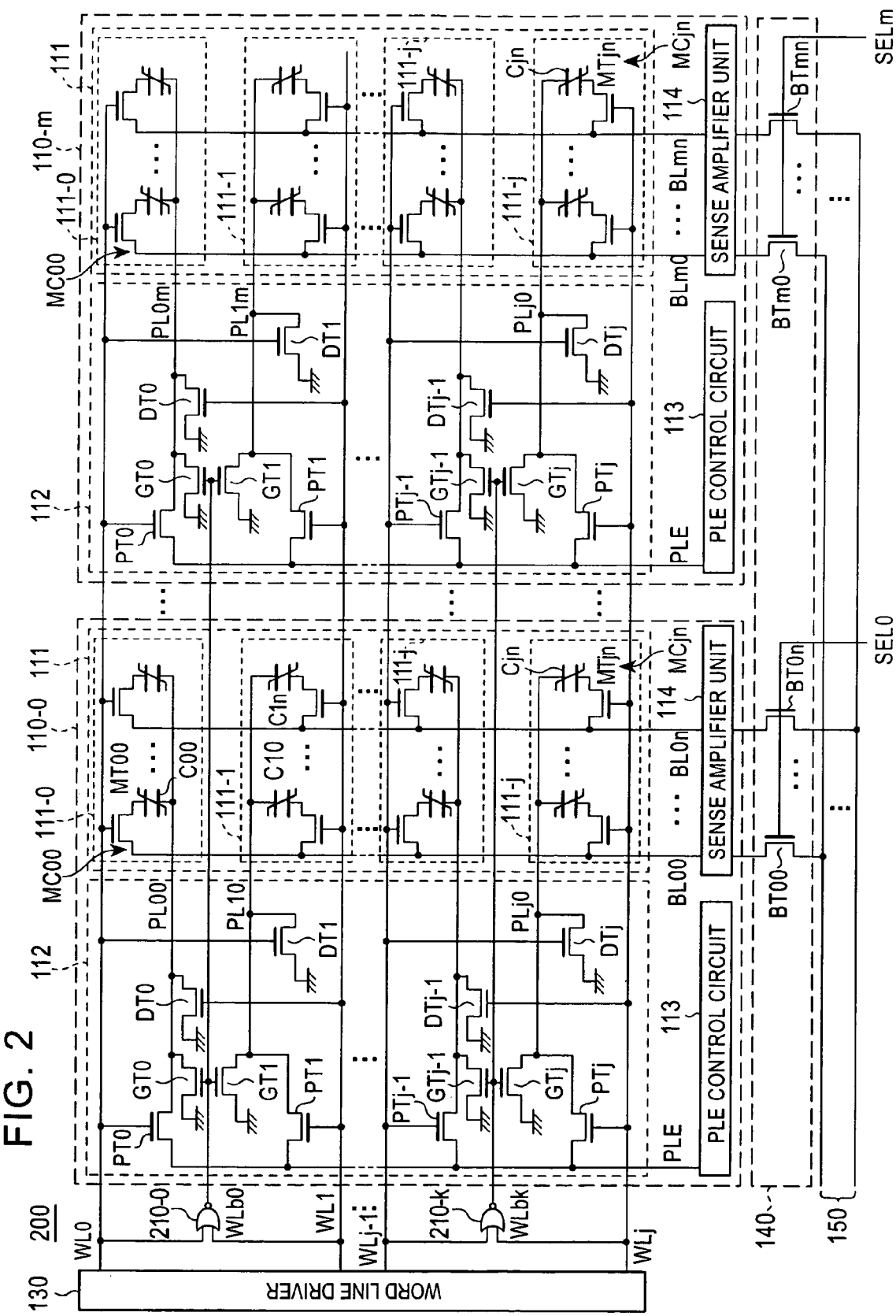
FIG. 2 is a circuit diagram showing the structure of an essential part of a ferroelectric memory according to a second embodiment.
Figure 3:
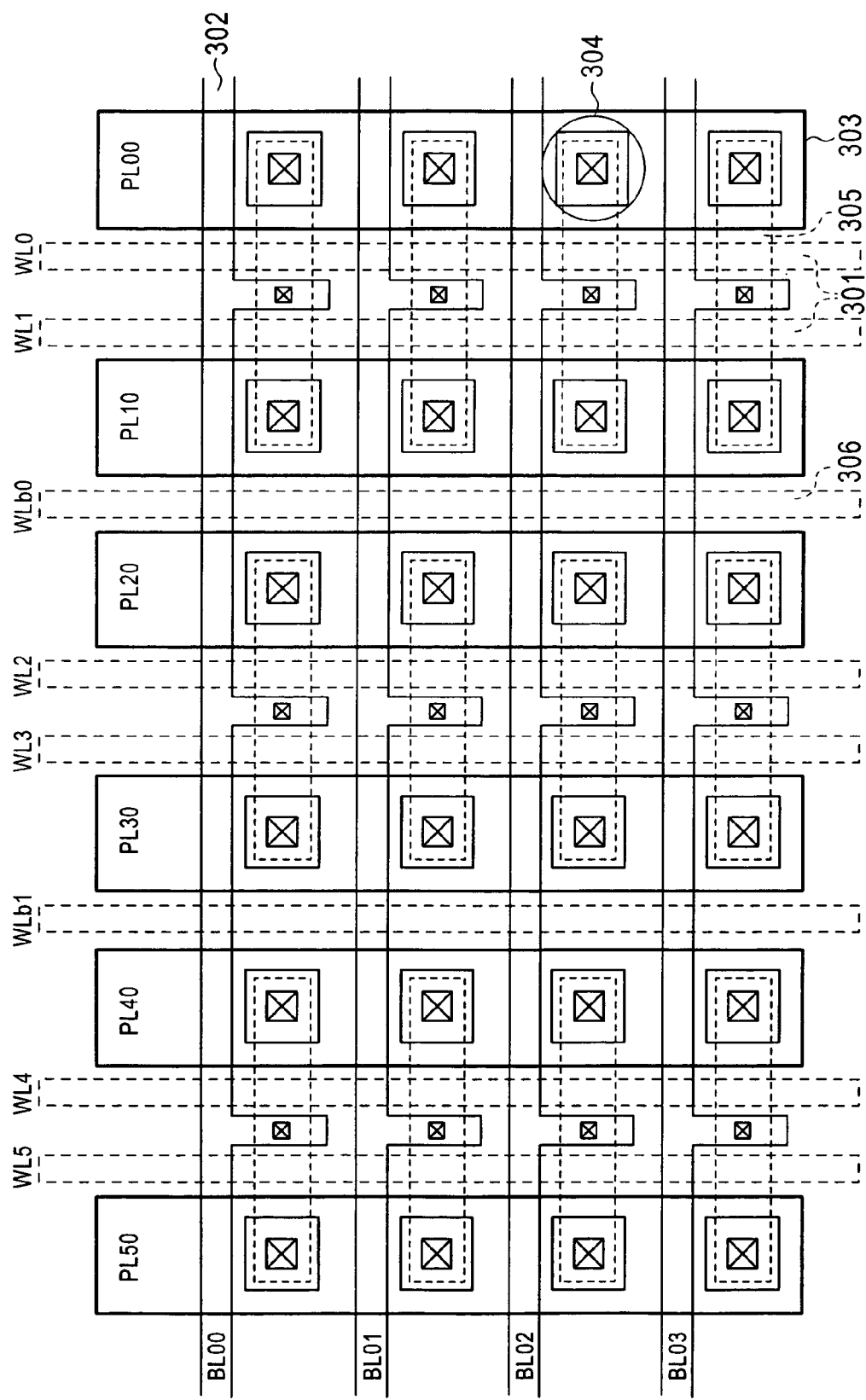
FIG. 3 is a plan view conceptually showing the layout structure in the ferroelectric memory according to the second embodiment.

FIG. 2 is a circuit diagram showing the structure of a ferroelectric memory 200 according to this embodiment. In FIG. 2, the constituent elements denoted by the same numerals as in FIG. 1 are the same constituent elements as in FIG. 1.

As shown in FIG. 2, the ferroelectric memory 200 according to this embodiment has k+1 (=(j+1)/2) inverse word lines WLb0 to WLbk. That is, this embodiment differs from the above-described first embodiment in that the inverse word lines are provided, not one for each row of memory cells but one for two rows each.

Moreover, the ferroelectric memory 200 according to this embodiment has k+1 two-input NOR gates 210-0 to 210-k instead of the inverters 120-0 to 120-j of the first embodiment. The output terminal of each of the NOR gates 210-0 to 210-k is connected to the corresponding inverse word line. Two input terminals of each of the NOR gates 210-0 to 210-k are connected to a pair of word lines corresponding to the inverse word line in question.

Furthermore, the ferroelectric memory 200 according to this embodiment differs from the first embodiment in that second transistors DT0 to DTj for grounding are provided in each plate line driver 112. The transistors DT0 to DTj are provided for the individual plate lines PL00 to PLjm, respectively. These transistors DT0 to DTj have their drains connected to the corresponding plate lines and have their sources grounded. Also, the gate of each of the transistors DT0 to DTj is connected to the word line in the other row of the pair of word lines corresponding to this transistor. For example, in FIG. 2, the transistor DT0 in the 0-th row has its gate connected to the word line WL1 in the first row. The connection of the transistors PT0 to PTj for plate voltage application is similar to the connection in the first embodiment. The transistors PT0 to PTj for plate voltage application have their respective gates connected to the corresponding word lines, have their respective sources connected to the corresponding plate lines, and input the potential of the plate-enable signal lines PLE of the corresponding PLE control circuits 113 from their respective drains. Also the connection of the transistors for grounding (in this embodiment, they are referred to as first transistors for grounding) GT0 to GTj is similar to the connection in the first embodiment. The first transistors for grounding GT0 to GTj have their respective gates connected to the corresponding inverse word lines, have their respective drains connected to the corresponding plate lines, and have their respective sources grounded.

As described above, in the ferroelectric memory 200 according to this embodiment, the inverse word lines are provided one for two rows of memory cells each. This facilitates pattern wiring on a chip and enables reduction in circuit scale. FIG. 3 is a plan view conceptually showing the layout structure in the ferroelectric memory 200 according to this embodiment. As shown in FIG. 3, the ferroelectric memory 200 according to this embodiment has polysilicon patterns 301 forming the word lines WL0, . . . , polysilicon patterns 302 forming the bit lines BL00, . . . , polysilicon patterns 303 forming the plate lines PL00, multilayer structures 304 forming the ferroelectric capacitors MC00, . . . , n-type diffusion regions 305 forming the selection transistors MT00, . . . , and polysilicon patterns 306 forming the inverse word lines WLb0, . . . . In this embodiment, as shown in FIG. 3, word lines WL0, WL1, . . . as gate electrode lines are arranged on the regions where the n-type diffusion regions 305 are formed, of the regions between the plate lines PL00, PL10, . . . , and the inverse word lines WLb0, . . . are arranged on the regions where the n-type diffusion regions 305 are not formed. Since this arrangement enables formation of the word lines WL0, WL1, . . . and the inverse word lines WLb0, WLb1, . . . in the same layer, increase in the area of the memory cell units and increase in the number of wiring layers can be prevented. Therefore, it is possible to reduce the manufacturing cost while improving the degree of integration of the chip on which the ferroelectric memory is mounted.

Next, reading operation from the ferroelectric memory 200 according to this embodiment will be described with reference to a case of reading data at address 00 as an example.

In the initial state, the word line driver 130 sets all the word lines WL0 to WLj at low level and the PLE control circuits 113 set the potential of all the plate-enable signal lines PLE at low level. In this state, since the selection transistors MT00 to MTjn in all the array blocks 110-0 to 110-m are off, the other ends of the ferroelectric capacitors C00 to Cjn are not connected to the bit lines BL00 to BLmn. Also, all the transistors PT0 to PTj for plate voltage application and the second transistors DT0 to DTj for grounding in each plate line driver 112 are off. On the other hand, since the inverse word lines WLb0 to WLbk are at high level, all the first transistors GT0 to GTj for grounding are on. Therefore, the plate lines PL00 to PLjm are at ground potential and the potential of the one-side ends of the ferroelectric capacitors C00 to Cjn is thus fixed at the ground potential.

In the case of reading data at address 00, first, the potential of the word line WL0 is changed to high level and the potential of the plate-enable signal line PLE in the array block 110-0 is changed to high level. In this state, the potential of the other word lines WL1 to WLj and the potential of the plate-enable signal lines PLE in the other array blocks 110-1 to 110-m remain at low level. As the potential of the word line WL0 is changed to high level, the selection transistors MT00 to MT0n in the memory cell unit 111-0 corresponding to address 00 are turned on and therefore the other ends of the ferroelectric capacitors C00 to C0n in this memory cell unit 111-0 are connected to the bit lines BL00 to BL0n.

Also, since the potential of the word line WL0 is changed to high level, the potential of the inverse word lines WLb0 is changed to low level and all the first transistors GT0 for grounding in the 0-th row in the array blocks 110-0 to 110-m are turned off. Since the potential of the word line WL1 is maintained at low level, the second transistor DT0 for grounding remains off. On the other hand, as the potential of the word line WL0 is changed to high level, the transistor PT0 for plate voltage application is turned on. Therefore, in the array blocks 110-0 to 110-m, the potential of the plate-enable signal line PLE is applied to the plate line PL0 in the 0-th row. At this point, the potential of the plate-enable signal line PLE in the array block 110-0 is at high level, whereas the potential of the plate-enable signal lines PLE in the other array blocks 110-1 to 110-m is at low level (that is, ground potential). Therefore, in the array block 110-0, the potential of the one-side ends of the ferroelectric capacitors C00 to C0n is changed to high level, and in the other array blocks 110-1 to 110-m, the potential of the one-side ends of the ferroelectric capacitors C00 to C0n is maintained at the ground potential.

Meanwhile, as the inverse word line WLb0 is changed to low level, the first transistor GT1 for grounding in the first row is turned off. However, since the word line WL0 is changed to high level, the second transistor DT1 for grounding is turned on. Therefore, the plate line PL1 in the first row is maintained at the ground potential. Since the wordline WL1 is at low level, the transistor PT1 for plate voltage application remains off. Therefore, in all the array blocks 110-0 to 110-m, the potential of the one-side ends of the ferroelectric capacitors C00 to C0n remains fixed at the ground potential.

Also, since the potential of the other word lines WL2 to WLj is maintained at low level, the potential of the inverse word lines WLb1 to WLbk is at high level. Therefore, the transistors PT1 to PTj for plate voltage application and the second transistors DT1 to DTj for grounding are off, and the first transistors GT1 to GTj for grounding remain on. Accordingly, in all the other array blocks 110-1 to 110-m, the potential of the one-side ends of the ferroelectric capacitors C10 to Cjn is maintained at the ground potential.

For these reasons, when the potential of the word line WL0 and the potential of the plate-enable signal line PLE in the array block 110-0 are changed to high level, only data in the memory cells MC00 to MC0n corresponding to address 00 are outputted as bit line potentials to the sense amplifier unit 114 in the array block 110-0.

Then, the selector unit 140 selects the bit lines BL00 to BL0n in the array block 110-0. This causes the potential of the bit lines BL00 to BL0n to be outputted to the bus 150.

After that, the sense amplifier unit 114 of the array block 110-0 outputs amplified bit line potential to these bit lines BL00 to BL0n. Rewriting to the ferroelectric capacitors C00 to C0n corresponding to address 00 is thus performed.

When the rewriting is finished, the potential of the word line WL0 is returned to low level and the potential of the plate-enable signal line PLE in the array block 110-0 is returned to low level. This ends the data reading operation.

Next, writing operation to the ferroelectric memory 200 according to this embodiment will be described with reference to a case of writing data at address 00 as an example.

The initial state is similar to the initial state of the above-described reading operation. That is, the word line driver 130 sets all the word lines WL0 to WLj at low level and the PLE control circuits 113 sets the potential of all the plate-enable signal lines PLE at low level. Therefore, the one-side ends of the ferroelectric capacitors C00 to Cjn are fixed at the ground potential and their other ends are not connected to the bit lines BL00 to BLmn.

In the case of writing data at address 00, the potential of the word line WL0 is changed to high level and the potential of the plate-enable signal line PLE in the array block 110-0 is changed to high level, as in the reading operation. Thus, other ends of the ferroelectric capacitors C00 to C0n are connected to the bit lines BL00 to BL0n. Also, while the potential of the one-side ends of the ferroelectric capacitors C00 to C0n in the array block 110-0 is changed to high level, the second transistor DT1 for grounding is turned on and therefore the potential of the one-side ends of the ferroelectric capacitors C10 to C1n is fixed at the ground potential, as in the above-described reading operation. The potential of the one-side ends of the ferroelectric capacitors in the second to j-th rows is fixed at the ground potential by the first transistors for grounding.

Then, the selector unit 140 selects the bit lines BL00 to BL0n in the array block 110-0. This causes the potential of the bus 150 to be outputted to the bit lines BL00 to BL0n.

Data corresponding to the potential of the bus 150 is thus written to the ferroelectric capacitors C00 to C0n corresponding to address 00.

After that, the potential of the word line WL0 is changed to low level and the potential of the plate-enable signal line PLE in the array block 110-0 is changed to low level. This ends the data writing operation.

As described above, in the ferroelectric memory 200 according to this embodiment, since the inverse word lines are provided one for two rows of memory cells each, it is possible to reduce the manufacturing cost while improving the degree of integration of the chip on which the ferroelectric memory is mounted.

Additionally, according to this embodiment, data destruction can be prevented, as in the first embodiment.

Third Embodiment

Next, a ferroelectric memory according to a third embodiment will be described with reference to FIG. 4.

Figure 4:
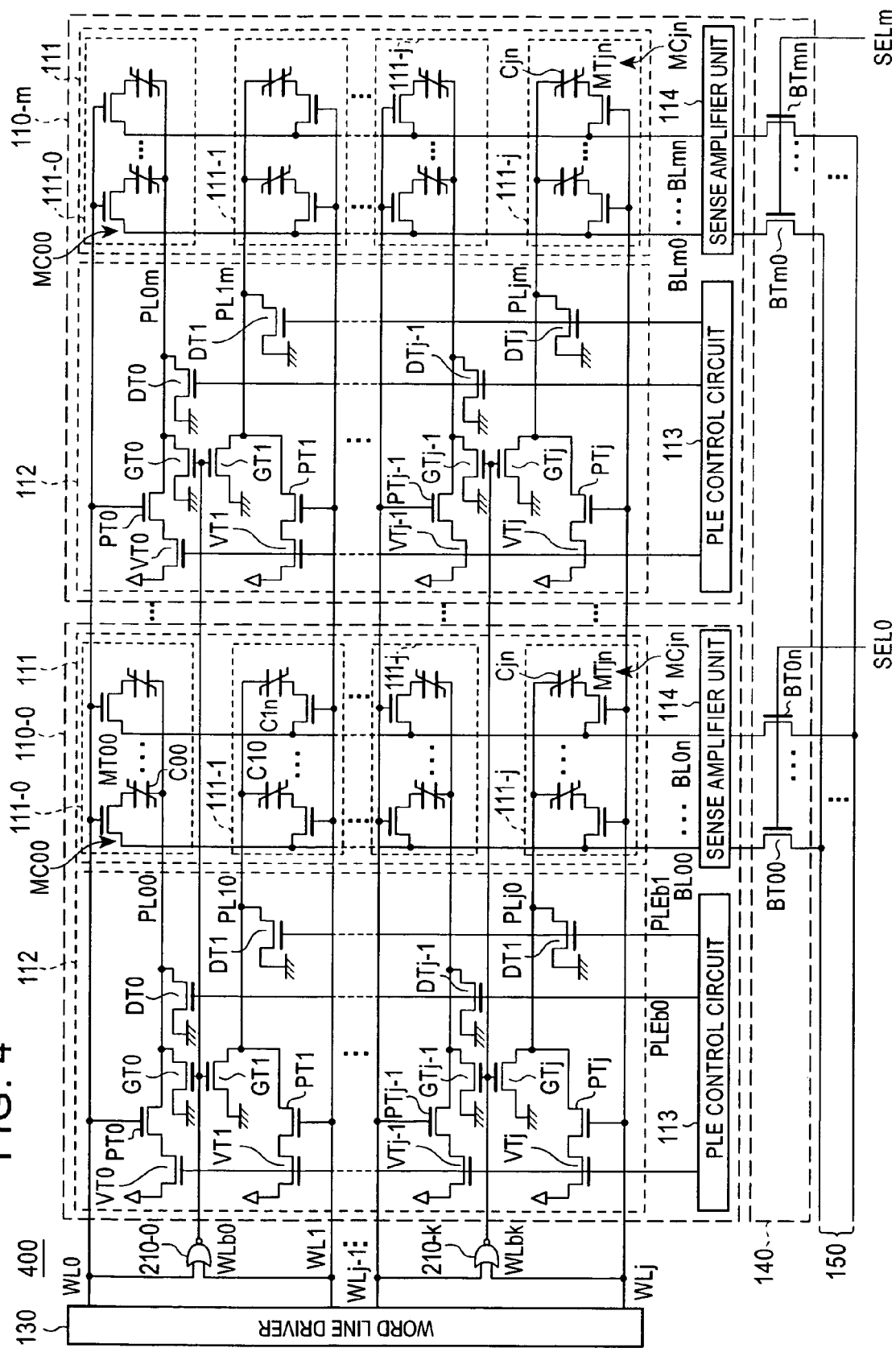
FIG. 4 is a circuit diagram showing the structure of an essential part of a ferroelectric memory according to a third embodiment.
Figure 5:
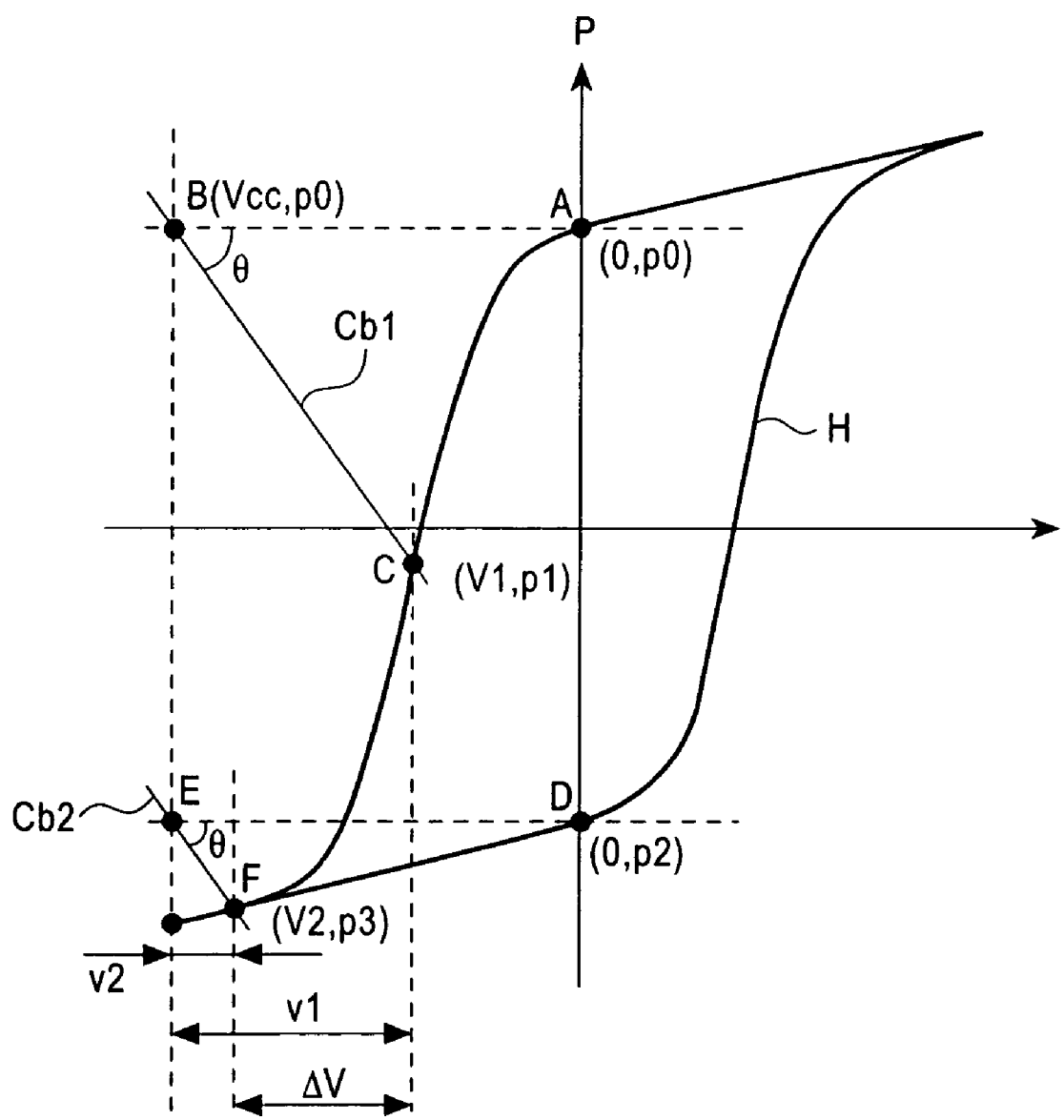
FIG. 5 is a characteristic graph for explaining the principle of a ferroelectric memory.
Figure 6:
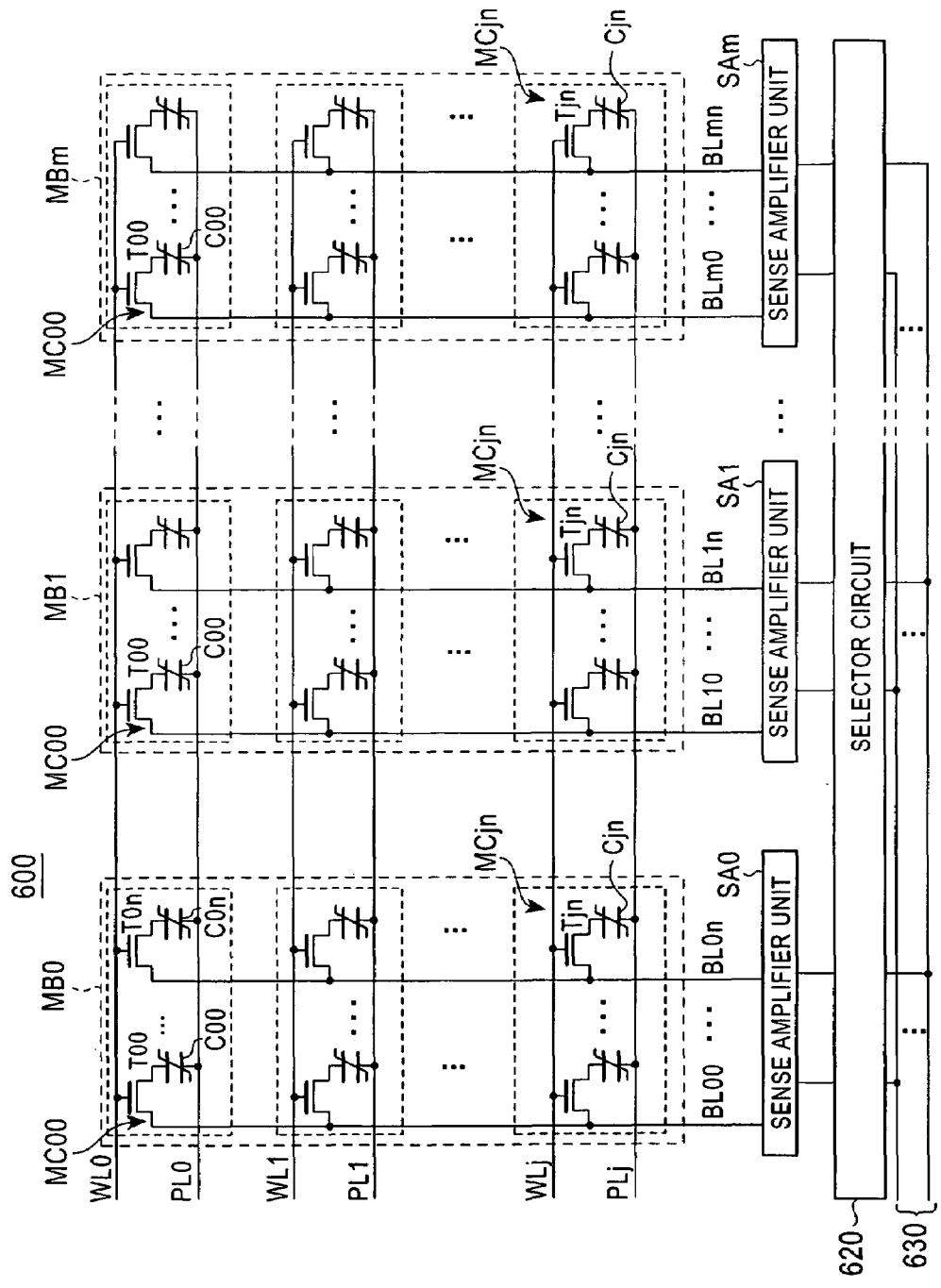
FIG. 6 is a circuit diagram showing the structure of an essential part of a conventional ferroelectric memory.

FIG. 4 is a circuit diagram showing the structure of a ferroelectric memory 400 according to this embodiment. In FIG. 4, the constituent elements denoted by the same numerals as in FIG. 2 are the same constituent elements as in FIG. 2.

As shown in FIG. 4, the ferroelectric memory 400 according to this embodiment has second transistors VT0 to VTj for plate voltage application. These transistors VT0 to VTj have their respective sources connected to power supply lines, have their respective drains connected to the sources of the transistors for plate voltage application (in this embodiment, referred to as first transistors for plate voltage application) PT0 to PTj, and input the potential of the plate-enable signal lines PLE at their respective gates.

Also, the ferroelectric memory 400 according to this embodiment differs from the above-described first embodiment in that the gates of the second transistors DT0 to DTj for grounding are not connected to the word lines WL to WLj but they input plate line control signals PLEb0, PLEb1, from the PLE control circuit 113. As shown in FIG. 4, the second transistors for grounding in the 0-th, second, . . . rows (of even ordinal numbers) are connected to the plate line control signal PLEb0, and the second transistors for grounding in the first, third, . . . rows (of odd ordinal numbers) are connected to the plate line control signal PLEb1.

Next, reading operation from the ferroelectric memory 400 according to this embodiment will be described with reference to a case of reading data at address 00 as an example.

In the initial state, the word line driver 130 sets all the word lines WL0 to WLj at low level. The PLE control circuits 113 set the potential of all the plate-enable signal lines PLE at low level and set all the plate line control signals PLEb0, PLEb1 at high level. In this state, since the selection transistors MT00 to MTjn in all the array blocks 110-0 to 110-m are off, the other ends of the ferroelectric capacitors C00 to Cjn are not connected to the bit lines BL00 to BLmn. Also, all the first transistors PT0 to PTj for plate voltage application and the second transistors VT0 to VTj for plate voltage application in each plate line driver 112 are off. On the other hand, since the inverse word lines WLb0 to WLbk are at high level, all the first transistors GT0 to GTj for grounding are on. Also, since the plate line control signals PLEb0, PLEb1 are at high level, the second transistors DT0 to DTj for grounding are on. Therefore, the plate lines PL00 to PLjm are at ground potential and the potential of the one-side ends of the ferroelectric capacitors C00 to Cjn is thus fixed at the ground potential.

In the case of reading data at address 00, first, the potential of the word line WL0 is changed to high level, and the potential of the plate-enable signal line PLE in the array block 110-0 is changed to high level, and the plate line control signal PLEb0 in the array block 110-0 is changed to low level. In this state, the potential of the other word lines WL1 to WLn and the potential of the plate-enable signal lines PLE in the other array blocks 110-1 to 110-m remain at low level. The other plate line control signal PLEb1 in the array block 110-0 and the plate line control signals PLEb0, PLEb1 in the other array blocks 110-1 to 110-m remain at high level.

As the potential of the word line WL0 is changed to high level, the selection transistors MT00 to MT0n in the memory cell unit 111-0 corresponding to address 00 are turned on and therefore the other ends of the ferroelectric capacitors C00 to C0n in this memory cell unit 111-0 are connected to the bit lines BL00 to BL0n. Also, since the potential of the word line WL0 is changed to high level and the potential of the plate-enable signal line PLE in the array block 110-0 is changed to high level, the transistors PT0, VT0 for plate voltage application are turned on and therefore the voltage of the power supply line is applied to the plate line PL0. Meanwhile, as the inverse word line WLb0 and the plate line control signal PLEb0 are changed to low level, the transistors GT0, DT0 for grounding are turned off. Therefore, in the array block 110-0, the potential of the one-side ends of the ferroelectric capacitors C00 to C0n is changed to high level.

In the other array blocks 110-1 to 110-m, as the word line WL0 is changed to high level, the transistor PT0 for plate voltage application in the 0-th row is turned on and the transistor GT0 for grounding is turned off. However, in these array blocks 110-1 to 110-m, since the potential of the plate-enable signal line PLE is maintained at low level and the plate line control signal PLEb0 is maintained at high level, the plate line PL0 is maintained in the grounded state.

On the other hand, in all the array blocks 110-0 to 110-m, since the word line WL1 in the first row remains at low level, the transistor PT1 for plate voltage application is maintained in the off-state. Also, since the plate line control signal PLEb1 remains at high level, the second transistor DT1 for grounding is maintained in the on-state. Therefore, even if the second transistor VT1 for plate voltage application is turned on by a change of the potential of the plate-enable signal line PLE to high level and the first transistor GT1 for grounding is turned off by a change of the inverse word line WLb0 to low level, the plate line PL1 is maintained in the grounded state.

Moreover, in all the array blocks 110-0 to 110-m, since the word lines WL2 to WLj in the second and subsequent rows remain at low level and the inverse word lines WLb1 to WLbk remain at high level, the transistors PT2 to PTj for plate voltage application are maintained in the off-state and the first transistors GT2 to GTj for grounding are maintained in the on-state. Therefore, the plate lines PL2 to PLj are maintained in the grounded state, irrespective of the potential of the plate-enable signal line PLE and the potential of the plate line control signals PLEb0, PLEb1.

For these reasons, when the potential of the word line WL0 and the potential of the plate-enable signal line PLE in the array block 110-0 are changed to high level, only the polarization of the ferroelectric capacitors C00 to C0n corresponding to address 00 is outputted as bit line potential to the sense amplifier unit 114 in the array block 110-0.

Then, the selector unit 140 selects the bit lines BL00 to BL0n in the array block 110-0. This causes the potential of the bit lines BL00 to BL0n to be outputted to the bus 150.

After that, the sense amplifier unit 114 of the array block 110-0 outputs amplified bit line potential to these bit lines BL00 to BL0n. Rewriting to the ferroelectric capacitors C00 to C0n corresponding to address 00 is thus performed.

When the rewriting is finished, the potential of the word line WL0 is returned to low level and the potential of the plate-enable signal line PLE in the array block 110-0 is returned to low level. This ends the data reading operation.

Next, writing operation to the ferroelectric memory 400 according to this embodiment will be described with reference to a case of writing data at address 00 as an example.

The initial state is similar to the initial state of the above-described reading operation. That is, the word line driver 130 sets all the word lines WL0 to WLj at low level, and the PLE control circuits 113 sets the potential of all the plate-enable signal lines PLE at low level and set the plate line control signals PLEb0, PLEb1 at high level. Therefore, the one-side ends of the ferroelectric capacitors C00 to Cjn are fixed at the ground potential and their other ends are not connected to the bit lines BL00 to BLmn.

In the case of writing data at address 00, the potential of the word line WL0 is changed to high level, and the potential of the plate-enable signal line PLE in the array block 110-0 is changed to high level, and the plate line control signal PLEb0 in the array block 110-0 is changed to low level, as in the reading operation. Thus, in the memory cell unit 111-0 corresponding to address 00, the other ends of the ferroelectric capacitors C00 to C0n are connected to the bit lines BL00 to BL0n. Also, while the potential of the one-side ends of the ferroelectric capacitors C00 to C0n in the array block 110-0 is changed to high level, the potential of the one-side ends of the ferroelectric capacitors C10 to C1n is fixed at the ground potential, as in the above-described reading operation. The potential of the one-side ends of the ferroelectric capacitors in the second to j-th rows is fixed at the ground potential.

Then, the selector unit 140 selects the bit lines BL00 to BL0n in the array block 110-0. This causes the potential of the bus 150 to be outputted to the bit lines BL00 to BL0n. Data corresponding to the potential of the bus 150 is thus written to the ferroelectric capacitors C00 to C0n corresponding to address 00.

After that, the potential of the word line WL0 is changed to low level and the potential of the plate-enable signal line PLE in the array block 110-0 is changed to low level. This ends the data writing operation.

As described above, in the ferroelectric memory 400 according to this embodiment, the potential (high level) of the plate line corresponding to the memory cell where reading or writing is performed is applied not from the plate-enable signal line PLE of the PLE control circuit 113 but from the power supply line. Also, the ground potential (low level) to the other memory cells in the same row as the memory cell where reading or writing is performed is supplied not from the plate-enable signal line PLE of the PLE control circuit 113 but from the ground line. This enables increase in rise and fall speed of the plate line potential.

Moreover, according to the embodiment, data destruction can be prevented, as in the first and second embodiments.

Furthermore, according to the embodiment, since the inverse word lines are provided one for two rows of memory cells each, it is possible to reduce the manufacturing cost while improving the degree of integration of the chip on which the ferroelectric memory is mounted, as in the second embodiment.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2004-110772 which is hereby incorporated by reference.

What is claimed is:

1. A ferroelectric memory comprising:
    a memory cell array formed by arraying memory cell units in a matrix, each memory cell unit having ferroelectric memory cells in one row and a plurality of columns;
    a plurality of word lines provided one for each row of the memory cell units, each word line being commonly connected to the ferroelectric memory cells in the same row;
    a plurality of plate lines provided one for each memory cell unit, each plate line being commonly connected to the ferroelectric memory cells in the same memory cell unit;
    a plurality of plate-enable signal lines provided one for each column of the memory cell units;
    a plurality of bit lines provided one for each column of the ferroelectric memory cells, each bit line being commonly connected to the ferroelectric memory cells in the same column;
    a word line driver for activating only the word line corresponding to a selected memory cell unit, of the plurality of word lines;
    a plurality of plate-enable control circuits provided one for each column of memory cell units, for activating only the plate-enable signal line corresponding to the selected memory cell unit, of the plurality of plate-enable signal lines; and
    a plurality of plate line drivers provided one for each column of the memory cell units, the plate line drivers supplying either one of an activation potential and a non-activation potential to the plate line corresponding to the activated word line in accordance with a potential of the plate-enable signal line and supplying the non-activation potential to plate lines corresponding to the non-activated word lines.

2. The ferroelectric memory as claimed in claim 1, further comprising:
    a plurality of inverse word lines provided one for each row of the memory cell units, each inverse word line supplying an inverse potential of the corresponding word line;
    first transistors provided in the plate line drivers one for each of the memory cell units, each first transistor having one end thereof connected to a corresponding one of the plate lines, having another end thereof connected to a corresponding one of the plate-enable signal lines and having a control electrode connected to a corresponding one of the word lines; and
    second transistors provided in the plate line drivers, one for each of the memory cell units, each of the second transistors having one end thereof connected to the corresponding one of the plate lines having another end thereof connected to a power supply line that supplies the non-activation potential, and having a control electrode connected to a corresponding one of the inverse word lines.

3. The ferroelectric memory as claimed in claim 1, further comprising:
- a plurality of inverse word lines, each being provided for two rows of the memory cell units and activated only when both word lines in a corresponding pair of word lines are at the non-activation potential;
- third transistors provided in the plate line drivers, one for each of the memory cell units, each of the third transistors having one end thereof connected to a corresponding one of the plate lines, having another end thereof connected to a corresponding one of the plate-enable signal lines, and having a control electrode connected to a corresponding one of the word lines;
- fourth transistors provided in the plate line drivers one for each of the memory cell units, each of the fourth transistors having one end thereof connected to the corresponding one of the plate lines, having another end thereof connected to a power supply line that supplies the non-activation potential, and having a control electrode connected to a corresponding one of the inverse word lines; and
- fifth transistors provided in the plate line drivers, one for each of the memory cell units, each of the fifth transistors having one end thereof connected to the corresponding one of the plate lines having another end thereof connected to the power supply line, and having a control electrode connected to a different one of the word lines of the corresponding pair of word lines.

4. The ferroelectric memory as claimed in claim 1, wherein the plate-enabled control circuits generate:
- first plate line control signals provided one for each column of the memory cell units, the first plate line control signals being inactivated when the memory cell units of odd ordinal numbers in the column are selected, the first plate line control signals being activated at other times; and
- second plate line control signals provided one for each column of the memory cell units, the second plate line control signals being inactivated when the memory cell units of even ordinal numbers in the column are selected, the second plate line control signals being activated at other times.

5. The ferroelectric memory as claimed in claim 4, further comprising:
- a plurality of inverse word lines, each being provided for two rows of the memory cell units, each inverse word line being activated only when both of a pair of corresponding word lines are at the non-activation potential;
- sixth transistors provided in the plate line drivers, one for each of the memory cell units, each of the sixth transistors having one end connected to a corresponding one of the plate lines and having a control electrode connected to a corresponding one of the word lines;
- seventh transistors provided in the plate line drivers, one for each of the memory cell units, each of the seventh transistors having one end connected to another of a corresponding one of the sixth transistors, having another end connected to a power supply line that supplies the activation potential, and having a control electrode connected to one of teh plate-enable signal lines;
- eight transistors provided in the plate line drivers, one for each of the memory cell units, each of the eighth transistors having one end connected to the corresponding one of the plate lines, having another end connected to a power supply line that supplies the non-activation potential, and having a control electrode connected to a corresponding one of the inverse word lines; and
- ninth transistors provided in the plate line drivers, one for each of the memory cell units, each of the ninth transistors having one end connected to the corresponding one of the plate lines, having another end connected to a power supply line that supplies the non-activation potential, and having a control electrode that receives one the first and second plate line control signals.

6. The ferroelectric memory as claimed in claim 1, wherein the non-activation potential is ground potential.

* * * * *